US009899262B2

(12) United States Patent
Hirata et al.

(10) Patent No.: US 9,899,262 B2
(45) Date of Patent: *Feb. 20, 2018

(54) WAFER PROCESSING METHOD

(71) Applicant: DISCO CORPORATION, Tokyo (JP)

(72) Inventors: Kazuya Hirata, Tokyo (JP); Yoko Nishino, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/232,404

(22) Filed: Aug. 9, 2016

(65) Prior Publication Data

US 2017/0053829 A1    Feb. 23, 2017

(30) Foreign Application Priority Data

Aug. 18, 2015   (JP) .................................. 2015-160848

(51) Int. Cl.

| *H01L 21/78* | (2006.01) |
|---|---|
| *H01L 23/544* | (2006.01) |
| *H01L 29/16* | (2006.01) |
| *H01L 21/04* | (2006.01) |
| *H01L 21/683* | (2006.01) |

(52) U.S. Cl.
CPC .......... *H01L 21/78* (2013.01); *H01L 21/0475* (2013.01); *H01L 21/6836* (2013.01); *H01L 23/544* (2013.01); *H01L 29/1608* (2013.01); *H01L 2221/6834* (2013.01); *H01L 2221/68327* (2013.01); *H01L 2223/5446* (2013.01);
(Continued)

(58) Field of Classification Search
CPC ... H01L 21/78; H01L 21/6836; H01L 23/544; H01L 29/1608; H01L 21/0475; H01L 2223/54453; H01L 2221/68327; H01L 2221/6834; H01L 2223/54426; H01L 2223/54493; H01L 2223/5446
See application file for complete search history.

(56) References Cited

U.S. PATENT DOCUMENTS

| 8,815,705 B2 | 8/2014 | Kato |
|---|---|---|
| 9,481,051 B2 | 11/2016 | Hirata et al. |

(Continued)

FOREIGN PATENT DOCUMENTS

JP    2002-373870    12/2002

OTHER PUBLICATIONS

U.S. Appl. No. 15/237,115, filed Aug. 15, 2016.

*Primary Examiner* — Kyoung Lee
(74) *Attorney, Agent, or Firm* — Greer Burns & Crain, Ltd.

(57) ABSTRACT

A wafer formed from an SiC substrate having a first surface and a second surface is divided into individual device chips. A division start point formed by a laser has a depth corresponding to the finished thickness of each device chip along each division line formed on the first surface. The focal point of the laser beam is set inside the SiC substrate at a predetermined depth from the second surface, and the laser beam is applied to the second surface while relatively moving the focal point and the SiC substrate to thereby form a modified layer parallel to the first surface and cracks extending from the modified layer along a c-plane, thus forming a separation start point. An external force is applied to the wafer, thereby separating the wafer into a first wafer having the first surface and a second wafer having the second surface.

4 Claims, 16 Drawing Sheets

(52) U.S. Cl.
 CPC ............... *H01L 2223/54426* (2013.01); *H01L 2223/54453* (2013.01); *H01L 2223/54493* (2013.01)

(56) References Cited

U.S. PATENT DOCUMENTS

| | | | |
|---|---|---|---|
| 9,620,415 B2* | 4/2017 | Hirata | ................... H01L 21/78 |
| 2013/0037825 A1 | 2/2013 | Hiraiwa et al. | |
| 2014/0001679 A1 | 1/2014 | Okuma et al. | |
| 2016/0126138 A1 | 5/2016 | Morikazu et al. | |
| 2016/0158882 A1 | 6/2016 | Hirata et al. | |

\* cited by examiner

WAFER PROCESSING METHOD

BACKGROUND OF THE INVENTION

Field of the Invention

The present invention relates to a wafer processing method for dividing a wafer into individual device chips, the wafer being composed of an SiC substrate and a plurality of devices formed on the front side of the SiC substrate.

Description of the Related Art

Various devices such as integrated circuits (ICs) and large-scale integrations (LSIs) are formed by forming a functional layer on the front side of a wafer formed from a silicon substrate and partitioning this functional layer into a plurality of regions along a plurality of crossing division lines. The back side of the wafer is ground by a grinding apparatus to thereby reduce the thickness of the wafer to a predetermined thickness. Thereafter, the division lines of the wafer are processed by a processing apparatus such as a cutting apparatus and a laser processing apparatus to thereby divide the wafer into a plurality of individual device chips corresponding to the respective devices. The device chips thus obtained are widely used in various electronic equipment such as mobile phones and personal computers.

Further, power devices or optical devices such as light-emitting diodes (LEDs) and laser diodes (LDs) are formed by forming a functional layer on the front side of a wafer formed from an SiC substrate and partitioning this functional layer into a plurality of regions along a plurality of crossing division lines. As similarly to the case of the silicon wafer mentioned above, the back side of the SiC wafer is ground by a grinding apparatus to thereby reduce the thickness of the SiC wafer to a predetermined thickness. Thereafter, the division lines of the SiC wafer are processed by a processing apparatus such as a cutting apparatus and a laser processing apparatus to thereby divide the SiC wafer into a plurality of individual device chips corresponding to the respective power devices or optical devices. The device chips thus obtained are widely used in various electronic equipment.

SUMMARY OF THE INVENTION

However, an SiC substrate has Mohs hardness much higher than that of a silicon substrate. Accordingly, in grinding the back side of a wafer formed from an SiC substrate by using a grinding wheel having abrasive members, there is a problem such that the abrasive members may wear in an amount approximately 4 times to 5 times the grinding amount of the wafer, causing very poor economy. For example, when the grinding amount of a silicon substrate is 100 μm, the wear amount of the abrasive members becomes 0.1 μm. In contrast, when the grinding amount of an SiC substrate is 100 μm, the wear amount of the abrasive members becomes 400 μm to 500 μm. Accordingly, the wear amount of the abrasive members in grinding an SiC substrate is 4000 times to 5000 times that in grinding a silicon substrate.

It is therefore an object of the present invention to provide a wear processing method which can thin a wafer formed from an SiC substrate to a predetermined thickness and divide the wafer into individual device chips, wherein a plurality of devices are previously formed on the front side of the SiC substrate.

In accordance with an aspect of the present invention, there is provided a wafer processing method for dividing a wafer into individual device chips, the wafer being formed from an SiC substrate having a first surface, a second surface opposite to the first surface, a c-axis extending from the first surface to the second surface, and a c-plane perpendicular to the c-axis, the wafer having a plurality of devices formed on the first surface of the SiC substrate so as to be separated by a plurality of crossing division lines. The wafer processing method includes: a division start point forming step of forming a division start point having a depth corresponding to the finished thickness of each device chip along each division line formed on the first surface; a protective member providing step of providing a protective member on the first surface after performing the division start point forming step; a separation start point forming step of setting the focal point of a laser beam having a transmission wavelength to the SiC substrate inside the SiC substrate at a predetermined depth from the second surface, which depth corresponds to a vertical position near the division start point, after performing the protective member providing step, and then applying the laser beam to the second surface as relatively moving the focal point and the SiC substrate to thereby form a modified layer parallel to the first surface and cracks extending from the modified layer along the c-plane, thus forming a separation start point; and a wafer separating step of applying an external force to the wafer after performing the separation start point forming step, thereby separating the wafer into a first wafer having the first surface of the SiC substrate and a second wafer having the second surface of the SiC substrate at the separation start point. The separation start point forming step includes: a modified layer forming step of relatively moving the focal point of the laser beam in a first direction perpendicular to a second direction where the c-axis is inclined by an off angle with respect to a normal to the second surface and the off angle is formed between the second surface and the c-plane, thereby linearly forming the modified layer extending in the first direction; and an indexing step of relatively moving the focal point in the second direction to thereby index the focal point by a predetermined amount.

Preferably, the first wafer is divided into the individual device chips by separating the wafer into the first wafer and the second wafer in the wafer separating step. Preferably, the wafer processing method further includes a grinding step of grinding the back side of the first wafer after performing the wafer separating step, thereby flattening the back side of the first wafer and dividing the first wafer into the individual device chips.

According to the wafer processing method of the present invention, the separation start point forming step is performed after performing the division start point forming step, thereby forming the separation start point inside the wafer in the whole area thereof, wherein the separation start point is composed of the modified layers and the cracks extending from the modified layers along the c-plane. Thereafter, an external force is applied to the wafer to thereby separate the wafer into two wafers, that is, the first wafer and the second wafer at the separation start point (along a separation plane) composed of the modified layers and the cracks. Accordingly, the wafer formed from the SiC substrate can be thinned and divided into the individual device chips without grinding the second surface of the SiC substrate, that is, the back side of the wafer by using abrasive members. As a result, the problem of uneconomical wearing of the abrasive members can be solved.

In the case of flattening the back side of the first wafer obtained by the wafer separating step mentioned above, it is only necessary to slightly grind the back side of the first wafer by an amount of approximately 1 μm to 5 μm, so that the wear amount of the abrasive members can be suppressed to approximately 4 µm to 25 µm. In addition, the second wafer separated from the first wafer can be reused as an SiC substrate, thereby achieving great economy.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
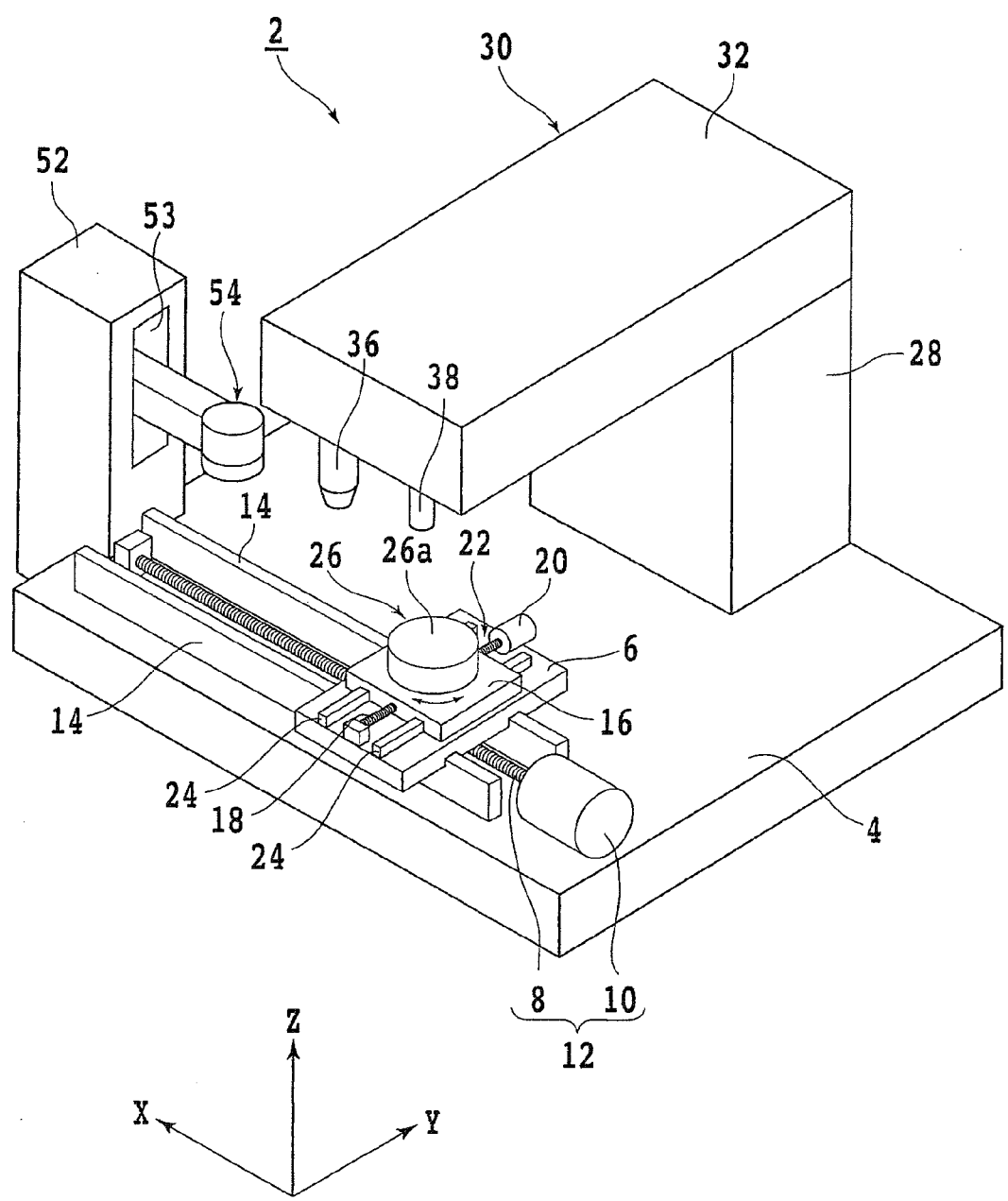
FIG. 1 is a perspective view of a laser processing apparatus suitable for use in performing the wafer processing method of the present invention.

A preferred embodiment of the present invention will now be described in detail with reference to the drawings. Referring to FIG. 1, there is shown a perspective view of a laser processing apparatus 2 suitable for use in performing the wafer processing method of the present invention. The laser processing apparatus 2 includes a stationary base 4 and a first slide block 6 mounted on the stationary base 4 so as to be movable in the X direction. The first slide block 6 is moved in a feeding direction, or in the X direction along a pair of guide rails 14 by a feeding mechanism 12 composed of a ball screw 8 and a pulse motor 10.

A second slide block 16 is mounted on the first slide block 6 so as to be movable in the Y direction. The second slide block 16 is moved in an indexing direction, or in the Y direction along a pair of guide rails 24 by an indexing mechanism 22 composed of a ball screw 18 and a pulse motor 20. A chuck table 26 having a suction holding portion 26a is mounted on the second slide block 16. The chuck table 26 is movable in the X direction and the Y direction by the feeding mechanism 12 and the indexing mechanism 22 and also rotatable by a motor stored in the second slide block 16.

A column 28 is provided on the stationary base 4 so as to project upward therefrom. A laser beam applying mechanism (laser beam applying means) 30 is mounted on the column 28. The laser beam applying mechanism 30 is composed of a casing 32, a laser beam generating unit 34 (see FIG. 2) stored in the casing 32, and focusing means (laser head) 36 mounted on the front end of the casing 32. An imaging unit 38 having a microscope and a camera is also mounted on the front end of the casing 32 so as to be aligned with the focusing means 36 in the X direction.

Figure 2:
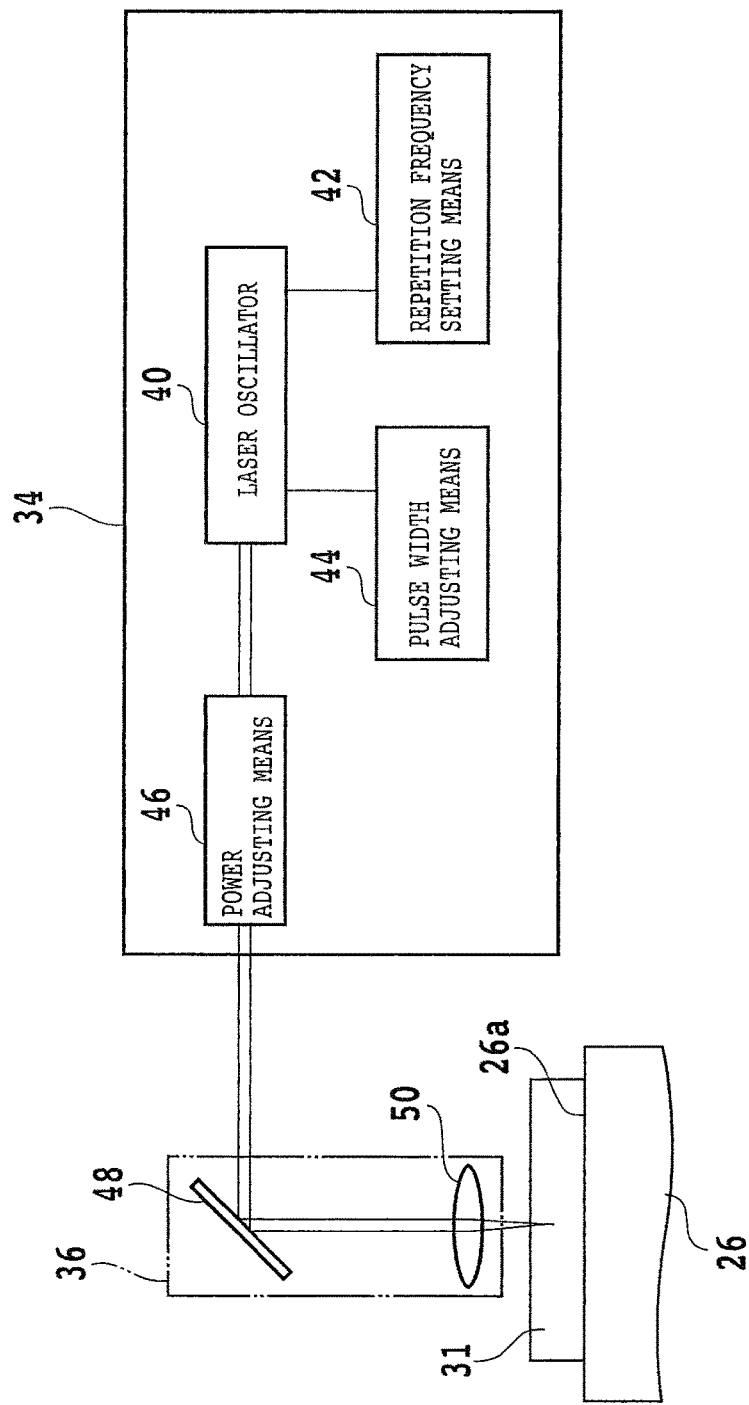
FIG. 2 is a block diagram of a laser beam generating unit.

As shown in FIG. 2, the laser beam generating unit 34 includes a laser oscillator 40 such as YAG laser and YVO4 laser for generating a pulsed laser beam, repetition frequency setting means 42 for setting the repetition frequency of the pulsed laser beam to be generated by the laser oscillator 40, pulse width adjusting means 44 for adjusting the pulse width of the pulsed laser beam to be generated by the laser oscillator 40, and power adjusting means 46 for adjusting the power of the pulsed laser beam generated by the laser oscillator 40. Although especially not shown, the laser oscillator 40 has a Brewster window, so that the laser beam generated from the laser oscillator 40 is a laser beam of linearly polarized light.

After the power of the pulsed laser beam is adjusted to a predetermined power by the power adjusting means 46 of the laser beam generating unit 34, the pulsed laser beam is reflected by a mirror 48 included in the focusing means 36 and next focused by a focusing lens 50 included in the focusing means 36. The focusing lens 50 is positioned so that the pulsed laser beam is focused inside an SiC wafer 31 (to be hereinafter described) as a workpiece held on the suction holding portion 26a of the chuck table 26.

Figure 3A:
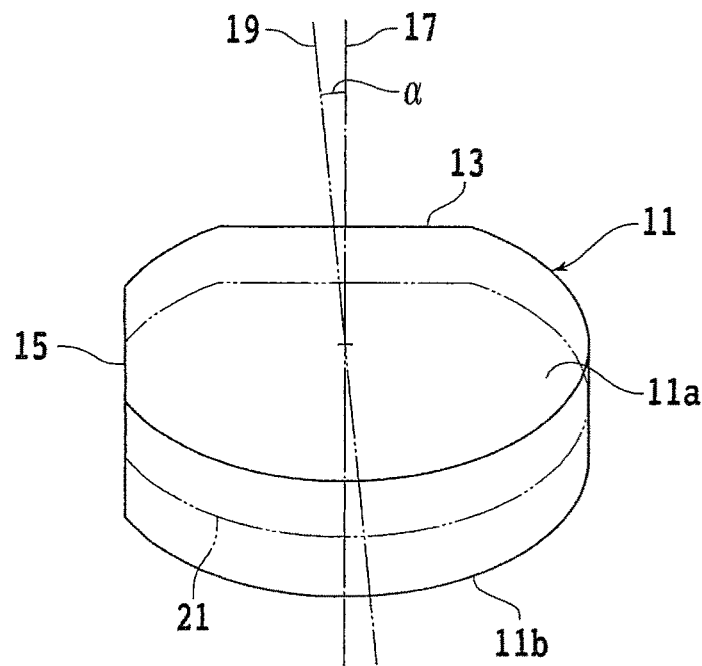
FIG. 3A is a perspective view of an SiC ingot.
Figure 3B:
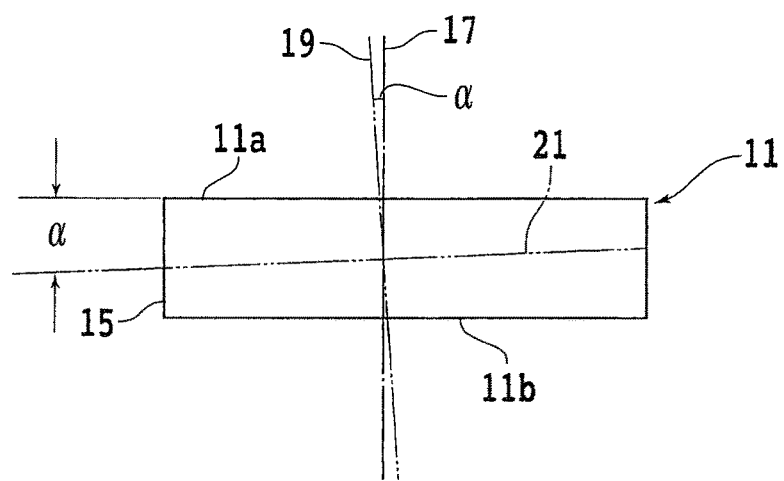
FIG. 3B is an elevational view of the SiC ingot shown in FIG. 3A.

Referring to FIG. 3A, there is shown a perspective view of an SiC ingot (which will be hereinafter referred to also simply as ingot) 11. FIG. 3B is an elevational view of the SiC ingot 11 shown in FIG. 3A. The ingot 11 has a first surface (upper surface) 11 and a second surface (lower surface) 11b opposite to the first surface 11a. The first surface 11a of the ingot 11 is preliminarily polished to a mirror finish because the laser beam is applied to the first surface 11a.

The ingot 11 has a first orientation flat 13 and a second orientation flat 15 perpendicular to the first orientation flat 13. The length of the first orientation flat 13 is set longer than the length of the second orientation flat 15. The ingot 11 has a c-axis 19 inclined by an off angle α toward the second orientation flat 15 with respect to a normal 17 to the upper surface ha and also has a c-plane 21 perpendicular to the c-axis 19. The c-plane 21 is inclined by the off angle α with respect to the upper surface 11a. In general, a hexagonal single crystal ingot including the SiC ingot 11, the direction perpendicular to the direction of extension of the shorter second orientation flat 15 is the direction of inclination of the c-axis 19. The c-plane 21 is set in the ingot 11 innumerably at the molecular level of the ingot 11. In this preferred embodiment, the off angle α is set to 4°. However, the off angle α is not limited to 4° in the present invention. For example, the off angle α may be freely set in the range of 1° to 6° in manufacturing the ingot 11.

Referring again to FIG. 1, a column 52 is fixed to the left side of the stationary base 4. The column 52 is formed with a vertically elongated opening 53, and a pressing mechanism 54 is vertically movably mounted to the column 52 so as to project from the opening 53.

Figure 4:
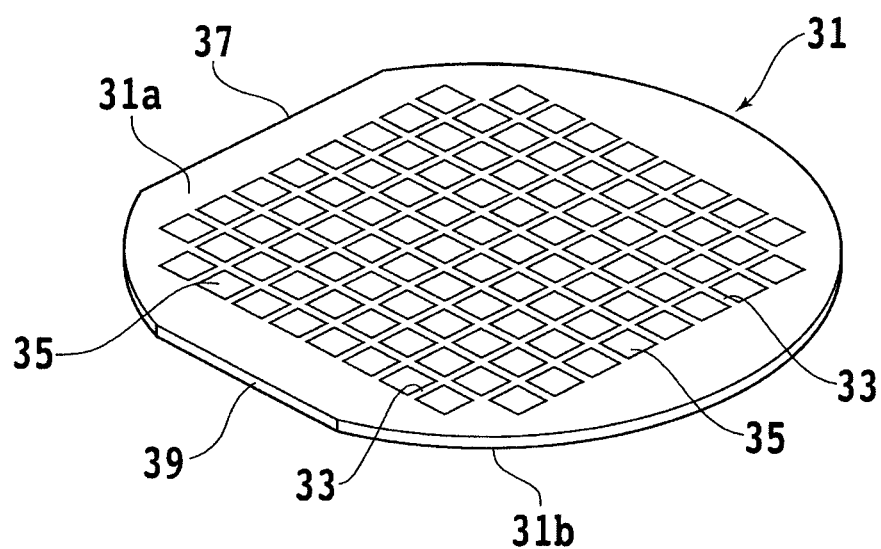
FIG. 4 is a perspective view of an SiC wafer as viewed from the front side thereof.

Referring to FIG. 4, there is shown a perspective view of an SiC wafer 31 (SiC substrate) having a front side 31a (first surface) and a back side 31b (second surface). FIG. 4 shows the front side 31a of the SiC wafer 31 in perspective. The SiC wafer (which will be hereinafter referred to also simply as wafer) 31 is obtained by slicing the SiC ingot 11 shown in FIGS. 3A and 3B with a wire saw. For example, the SiC wafer 31 has a thickness of approximately 700 μm. After polishing the front side 31a of the wafer 31 to a mirror finish, a plurality of devices 35 such as power devices are formed on the front side 31a of the wafer 31 by photolithography. A plurality of crossing division lines 33 are formed on the front side 31a of the wafer 31 to thereby define a plurality of separate regions where the respective plural devices 35 are formed.

The SiC wafer 31 has a first orientation flat 37 and a second orientation flat 39 perpendicular to the first orientation flat 37. The length of the first orientation flat 37 is set longer than the length of the second orientation flat 39. Since the SiC wafer 31 is obtained by slicing the SiC ingot 11 shown in FIGS. 3A and 3B with a wire saw, the first orientation flat 37 corresponds to the first orientation flat 13 of the ingot 11, and the second orientation flat 39 corresponds to the second orientation flat 15 of the ingot 11.

The wafer 31 has a c-axis 19 inclined by an off angle α toward the second orientation flat 39 with respect to a normal 17 to the front side 31a and also has a c-plane 21 perpendicular to the c-axis 19 (see FIGS. 3A and 3B). The c-plane 21 is inclined by the off angle α with respect to the front side 31a. In the SiC wafer 31, the direction perpendicular to the direction of extension of the shorter second orientation flat 39 is the direction of inclination of the c-axis 19.

Figure 5:
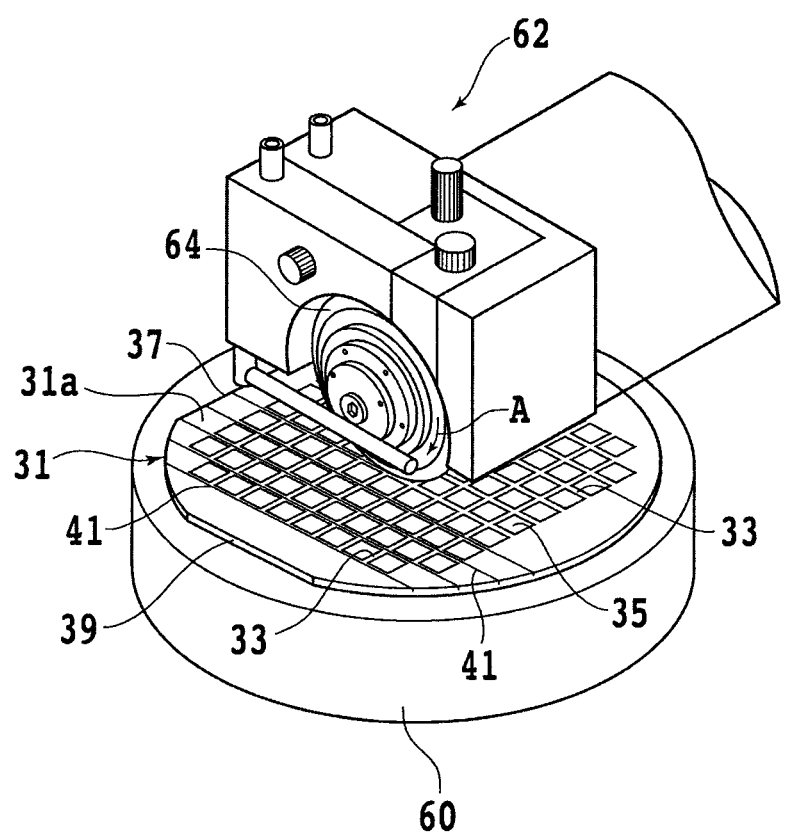
FIG. 5 is a perspective view showing a first preferred embodiment of a division start point forming step constituting the wafer processing method of the present invention.

In the wafer processing method of the present invention, a division start point forming step is first performed in such a manner that a division start point having a depth corresponding to the finished thickness of each device chip is formed along each division line 33 formed on the first surface (front side) 31a. Referring to FIG. 5, a first preferred embodiment of this division start point forming step is shown. The first preferred embodiment shown in FIG. 5 is performed by using a cutting apparatus including a chuck table 60 for holding the wafer 31 and a cutting unit 62 for cutting the wafer 31 held on the chuck table 60. The cutting unit 62 has a cutting blade 64 adapted to be rotated in the direction shown by an arrow A in FIG. 5. The wafer 31 is held on the chuck table 60 in the condition where the front side 31a is oriented upward. The cutting blade 64 of the cutting unit 62 is rotated at a high speed in the direction of the arrow A and then lowered to cut in the wafer 31 to a predetermined depth (e.g., approximately 50 μm) corresponding to the finished thickness of each device chip in an area corresponding to a predetermined one of the division lines 33 extending in a first direction. Thereafter, the chuck table 60 is fed in the X direction to thereby form a groove 41 as the division start point on the front side 31a along this predetermined division line 33.

Thereafter, the cutting unit 62 is indexed in the Y direction to similarly form a plurality of grooves 41 along all of the other division lines 33 extending in the first direction. Thereafter, the chuck table 60 is rotated 90° to similarly form a plurality of grooves 41 along all of the division lines 33 extending in a second direction perpendicular to the first direction.

For example, the first preferred embodiment of the division start point forming step is performed under the following processing conditions.

Figure 6:
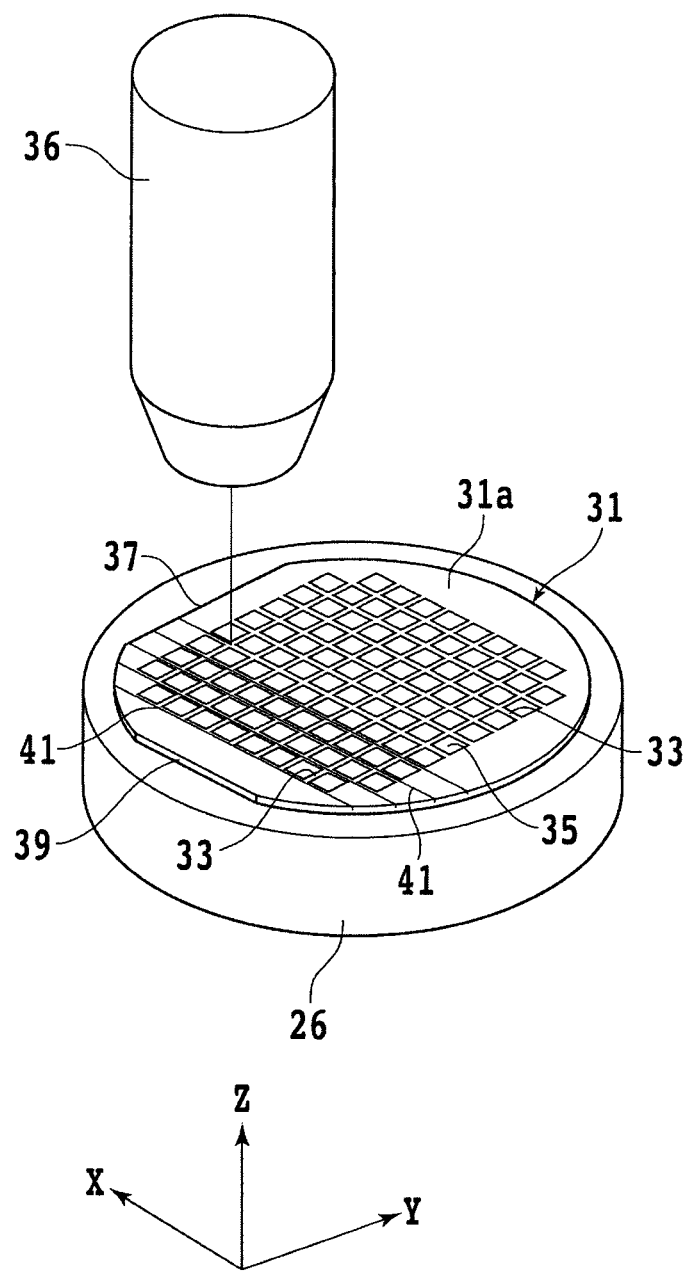
FIG. 6 is a perspective view showing a second preferred embodiment of the division start point forming step.

Thickness of the cutting blade 64: 30 μm
Diameter of the cutting blade 64: 50 mm
Rotational speed of the cutting blade 64: 20000 rpm
Work feed speed: 10 mm/second Referring to FIG. 6, there is shown a perspective view for illustrating a second preferred embodiment of the division start point forming step according to the present invention. The second preferred embodiment shown in FIG. 6 is performed by using the laser processing apparatus 2 shown in FIG. 1. The SiC wafer 31 is held on the chuck table 26 in the condition where the front side 31a is oriented upward. A laser beam having an absorption wavelength (e.g., 355 nm) to the SiC wafer 31 is applied from the focusing means 36 to the front side 31a along a predetermined one of the division lines 33 extending in a first direction as feeding the chuck table 26 in the X direction, thereby performing ablation to form a groove 41 as the division start point on the front side 31a along this predetermined division line 33.

Thereafter, the chuck table 26 is indexed in the Y direction to similarly form a plurality of grooves 41 along all of the other division lines 33 extending in the first direction. Thereafter, the chuck table 26 is rotated 90° to similarly form a plurality of grooves 41 along all of the division lines 33 extending in a second direction perpendicular to the first direction.

For example, the second preferred embodiment of the division start point forming step is performed under the following processing conditions.

Light source: Nd:YAG pulsed laser
Wavelength of the laser beam: 355 nm
Repetition frequency: 50 kHz
Spot diameter: 10 μm
Average power: 2 W
Work feed speed: 100 mm/second Although not shown, a third preferred embodiment of the division start point forming step may be performed by using the laser processing apparatus 2 shown in FIG. 1. In the third preferred embodiment, a laser beam having a transmission wavelength (e.g., 1064 nm) to the SiC wafer 31 is applied from the focusing means 36 to the front side 31a or the back side 31b of the SiC wafer 31 along a predetermined one of the division lines 33 extending in a first direction as feeding the chuck table 26 in the X direction, thereby forming a modified layer as the division start point near the front side 31a (at a depth of approximately 50 μm from the front side 31a) along this predetermined division line 33.

Thereafter, the chuck table 26 is indexed in the Y direction to similarly form a plurality of modified layers along all of the other division lines 33 extending in the first direction. Thereafter, the chuck table 26 is rotated 90° to similarly form a plurality of modified layers along all of the division lines 33 extending in a second direction perpendicular to the first direction.

For example, the third preferred embodiment of the division start point forming step is performed under the following processing conditions.

Figure 7:
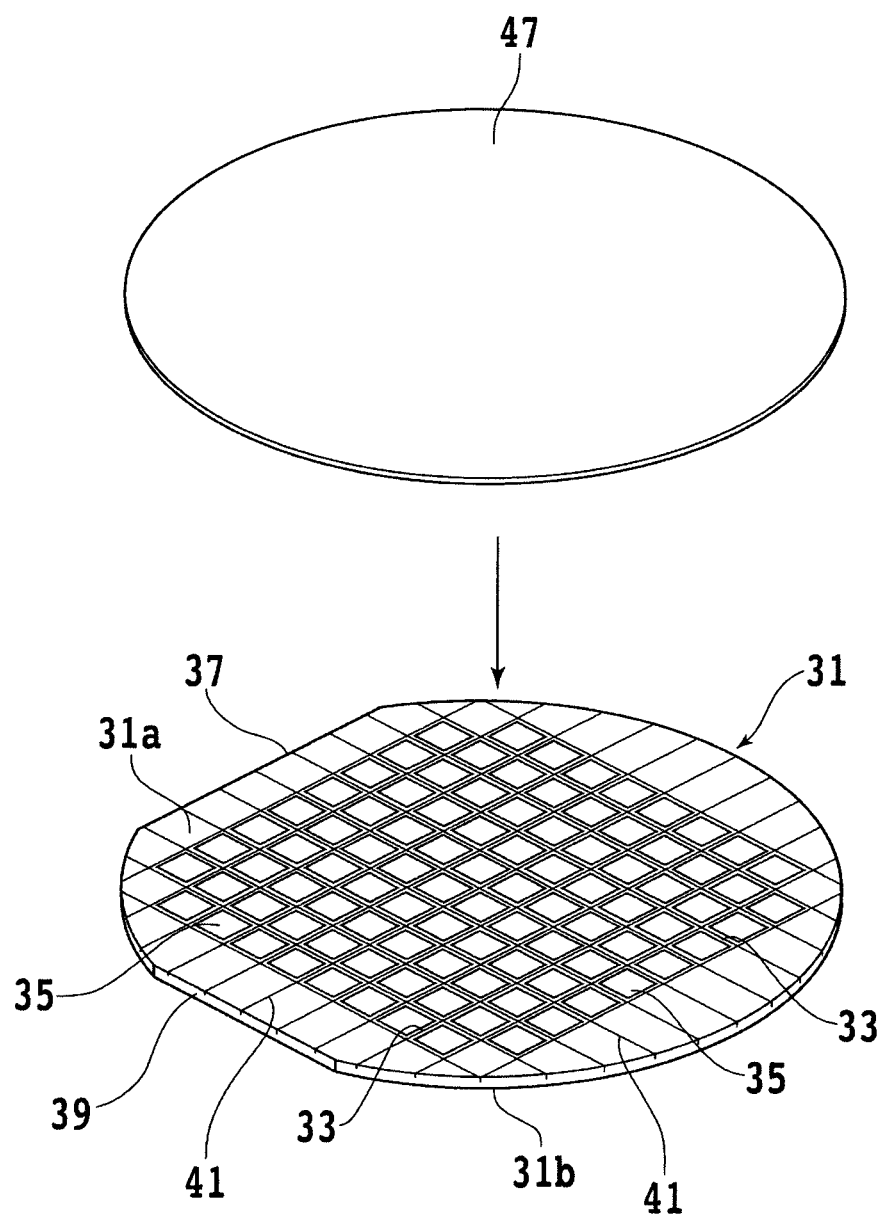
FIG. 7 is a perspective view showing a step of attaching a protective tape to the front side of the SiC wafer after performing the division start point forming step.
Figure 8A:
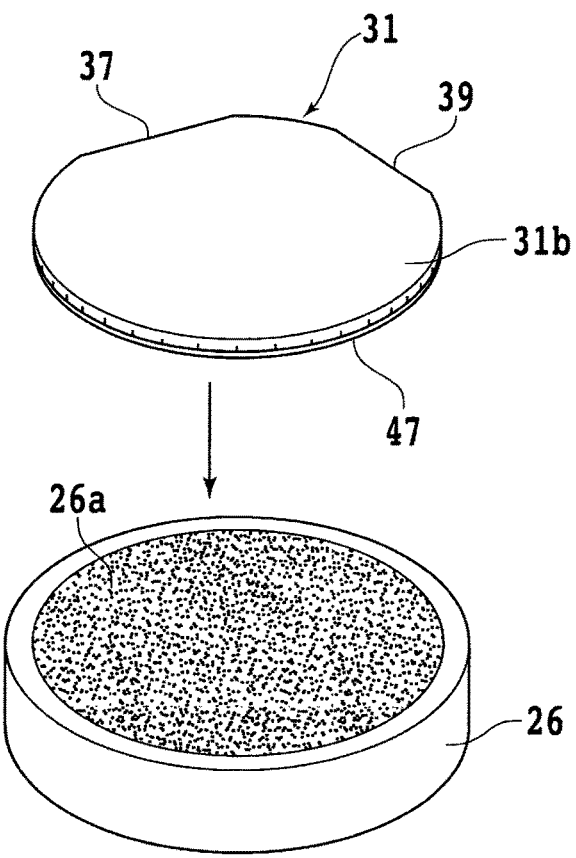
FIG. 8A is a perspective view showing a step of placing the SiC wafer through the protective tape on a chuck table.
Figure 8B:
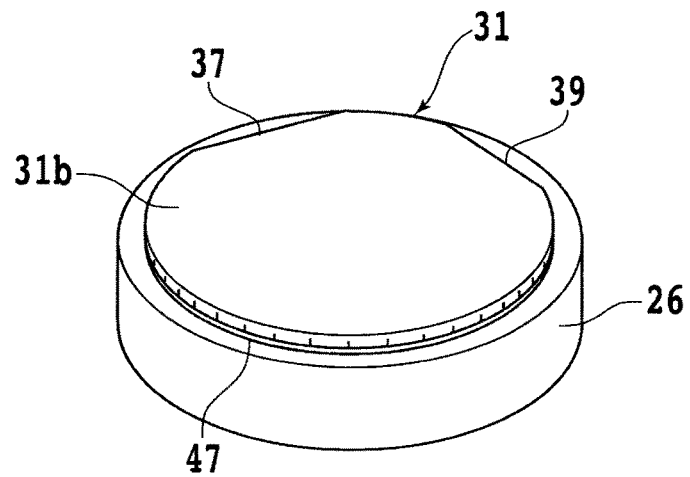
FIG. 8B is a perspective view showing a condition where the SiC wafer shown in FIG. 8A is held on the chuck table under suction.

Light source: Nd:YAG pulsed laser
Wavelength of the laser beam: 1064 nm
Repetition frequency: 50 kHz
Spot diameter: 10 μm
Average power: 1 W
Work feed speed: 300 mm/second After performing the division start point forming step, a protective tape attaching step (protective member providing step) is performed as shown in FIG. 7 in such a manner that a protective tape 47 (protective member) is attached to the front side 31a of the wafer 31, in which the grooves 41 as the division start point have been formed on the front side 31a along the division lines 33. After attaching the protective tape 47 to the front side 31a of the wafer 31, the wafer 31 with the protective tape 47 is placed on the chuck table 26 in the condition where the protective tape 47 comes into contact with the upper surface of the chuck table 26 as shown in FIG. 8A. Then, a vacuum is applied to the suction holding portion 26a of the chuck table 26 to hold the wafer 31 through the protective tape 47 on the chuck table 26 under suction as shown in FIG. 8B. In this condition, the back side 31b of the wafer 31 held on the chuck table 26 is exposed upward.

Figure 9:
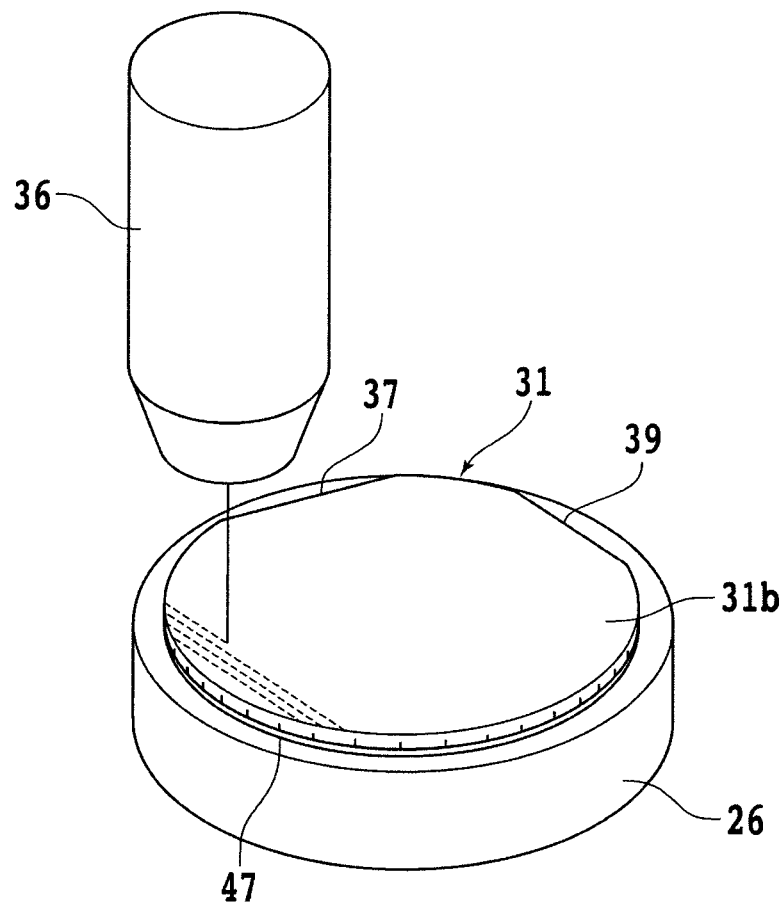
FIG. 9 is a perspective view for illustrating a separation start point forming step.
Figure 10:
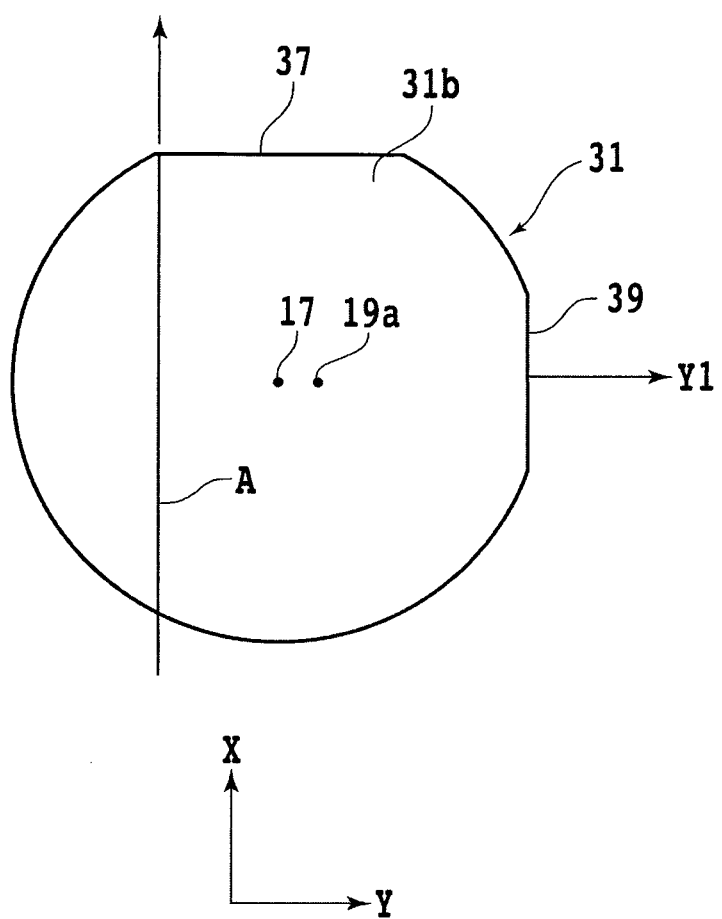
FIG. 10 is a plan view of the SiC wafer shown in FIG. 9 as viewed from the back side thereof.

Thereafter, the chuck table 26 holding the wafer 31 is rotated so that the second orientation flat 39 of the wafer 31 becomes parallel to the X direction as shown in FIGS. 9 and 10. In other words, as shown in FIG. 10, the direction of formation of the off angle α is shown by an arrow Y1. That is, the direction of the arrow Y1 is the direction where the intersection 19a between the c-axis 19 and the back side 31b of the wafer 31 is present with respect to the normal 17 to the back side 31b. Further, the direction perpendicular to the direction of the arrow Y1 is shown by an arrow A. Then, the chuck table 26 holding the wafer 31 is rotated so that the direction of the arrow A becomes parallel to the X direction, that is, the direction of the arrow A parallel to the second orientation flat 39 coincides with the X direction.

Accordingly, the laser beam is scanned in the direction of the arrow A perpendicular to the direction of the arrow Y1, or perpendicular to the direction of formation of the off angle α. In other words, the direction of the arrow A perpendicular to the direction of the arrow Y1 where the off angle α is formed is defined as the feeding direction of the chuck table 26. In the wafer processing method of the present invention, it is important that the scanning direction of the laser beam to be applied from the focusing means 36 is set to the direction of the arrow A perpendicular to the direction of the arrow Y1 where the off angle α of the wafer 31 is formed. That is, it was found that by setting the scanning direction of the laser beam to the direction of the arrow A as mentioned above in the wafer processing method of the present invention, cracks propagating from a modified layer formed inside the wafer 31 by the laser beam extend very long along the c-plane 21.

Figure 11:
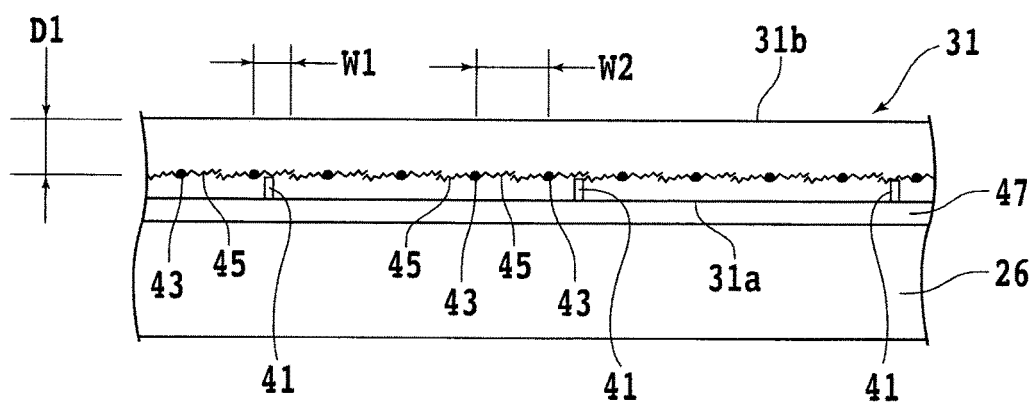
FIG. 11 is a schematic sectional view for illustrating a modified layer forming step.

In performing the wafer processing method according to this preferred embodiment, a separation start point forming step is performed in such a manner that the focal point of the laser beam having a transmission wavelength (e.g., 1064 nm) to the wafer 31 (SiC substrate) held on the chuck table 26 is set inside the wafer 31 at a predetermined depth from the back side 31b (second surface), which depth corresponds to a vertical position near each groove 41 as the division start point, and the laser beam is applied to the back side 31b as relatively moving the focal point and the wafer 31 to thereby form a modified layer 43 parallel to the front side 31a and cracks 45 propagating from the modified layer 43 along the c-plane 21, thus forming a separation start point (see FIG. 11).

This separation start point forming step includes a modified layer forming step of relatively moving the focal point of the laser beam in the direction of the arrow A perpendicular to the direction of the arrow Y1 where the c-axis 19 is inclined by the off angle α with respect to the normal 17 to the back side 31b and the off angle α is formed between the c-plane 21 and the back side 31b as shown in FIG. 10, thereby forming the modified layer 43 inside the wafer 31 and also forming the cracks 45 propagating from the modified layer 43 along the c-plane 21. The separation start point forming step further includes an indexing step of relatively moving the focal point in the direction of formation of the off angle α, i.e., in the Y direction to thereby index the focal point by a predetermined amount as shown in FIGS. 11 and 12.

Figure 12:
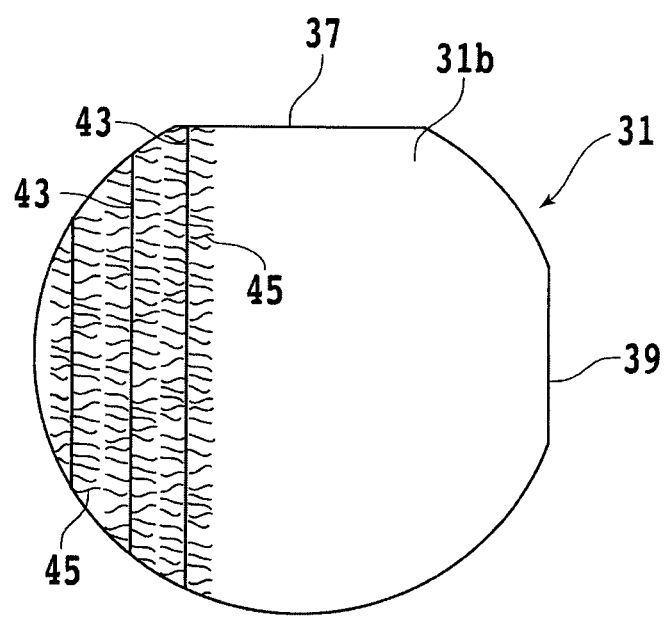
FIG. 12 is a schematic plan view for illustrating the modified layer forming step.

As shown in FIGS. 11 and 12, the modified layer 43 is linearly formed so as to extend in the X direction, so that the cracks 45 propagate from the modified layer 43 in opposite directions along the c-plane 21. In the wafer processing method according to this preferred embodiment, the separation start point forming step further includes an index amount setting step of measuring the width of the cracks 45 formed on one side of the modified layer 43 along the c-plane 21 and then setting the index amount of the focal point according to the width measured above. More specifically, letting W1 denote the width of the cracks 45 formed on one side of the modified layer 43 so as to propagate from the modified layer 43 along the c-plane 21, the index amount W2 of the focal point is set in the range of W1 to 2W1.

For example, the separation start point forming step is performed under the following laser processing conditions.

Light source: Nd:YAG pulsed laser
Wavelength: 1064 nm
Repetition frequency: 80 kHz
Average power: 3.2 W
Pulse width: 4 ns
Spot diameter: 10 μm
Work feed speed: 500 mm/second
Index amount: 400 μm In the laser processing conditions mentioned above, the width W1 of the cracks 45 propagating from the modified layer 43 along the c-plane 21 in one direction as viewed in FIG. 11 is set to approximately 250 μm, and the index amount W2 is set to 400 μm. However, the average power of the laser beam is not limited to 3.2 W. When the average power of the laser beam was set to 2 W to 4.5 W, good results were obtained in the preferred embodiment. In the case that the average power was set to 2 W, the width W1 of the cracks 45 was approximately 100 μm. In the case that the average power was set to 4.5 W, the width W1 of the cracks 45 was approximately 350 μm.

In the case that the average power is less than 2 W or greater than 4.5 W, the modified layer 43 cannot be well formed inside the wafer 31. Accordingly, the average power of the laser beam to be applied is preferably set in the range of 2 W to 4.5 W. For example, the average power of the laser beam to be applied to the wafer 31 was set to 3.2 W in this preferred embodiment. As shown in FIG. 11, the depth D1 of the focal point from the back side 31b in forming the modified layer 43 was set to 650 μm because the depth of each groove 41 corresponding to the finished thickness was set to approximately 50 μm.

In this manner, the focal point of the laser beam is sequentially indexed to form a plurality of modified layers 43 at the depth D1 from the back side 31b of the wafer 31 in the whole area of the wafer 31 and also to form the cracks 45 extending from each modified layer 43 along the c-plane 21 as shown in FIG. 12. Thereafter, a wafer separating step is performed in such a manner that an external force is applied to the wafer 31 to thereby separate the wafer 31 into two wafers at the separation start point composed of the modified layers 43 and the cracks 45, thus reducing the thickness of the wafer 31 to a finished thickness of approximately 50 μm.

Figure 13A:
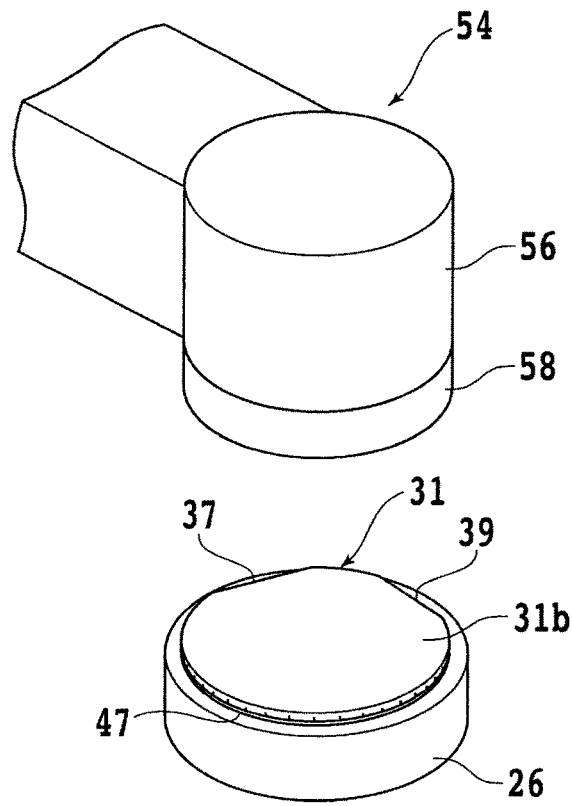
FIGS. 13A and 13B are perspective views for illustrating a wafer separating step.
Figure 13B:
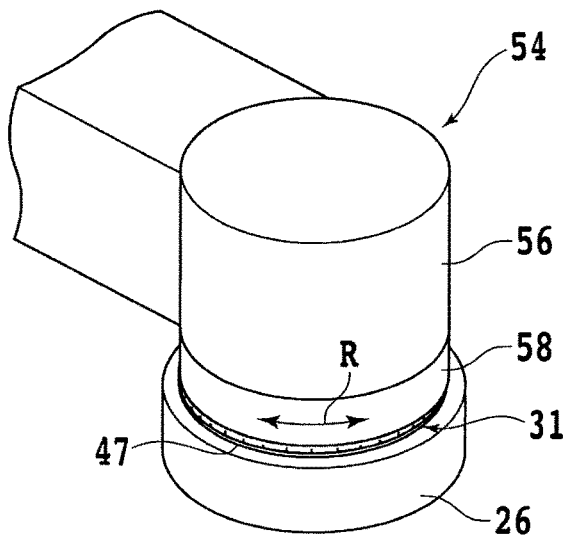

This wafer separating step is performed by using the pressing mechanism 54 shown in FIG. 1. The configuration of the pressing mechanism 54 is shown in FIGS. 13A and 13B. The pressing mechanism 54 includes a head 56 vertically movable by a moving mechanism (not shown) incorporated in the column 52 shown in FIG. 1 and a pressing member 58 rotatable in the direction shown by an arrow R in FIG. 13B with respect to the head 56. As shown in FIG. 13A, the pressing mechanism 54 is relatively positioned above the wafer 31 held on the chuck table 26. Thereafter, as shown in FIG. 13B, the head 56 is lowered until the pressing member 58 comes into pressure contact with the back side 31b of the wafer 31.

In the condition where the pressing member 58 is in pressure contact with the back side 31b of the wafer 31, the pressing member 58 is rotated in the direction of the arrow R to thereby generate a torsional stress in the wafer 31. As a result, the wafer 31 is broken at the separation start point where the modified layers 43 and the cracks 45 are formed. Accordingly, as shown in FIG. 14, the wafer 31 can be separated into a first wafer 31A held on the chuck table 26 and a second wafer 31B, wherein the first wafer 31A has the front side 31a (first surface) and the second wafer 31B has the back side 31b (second surface).

Figure 14:
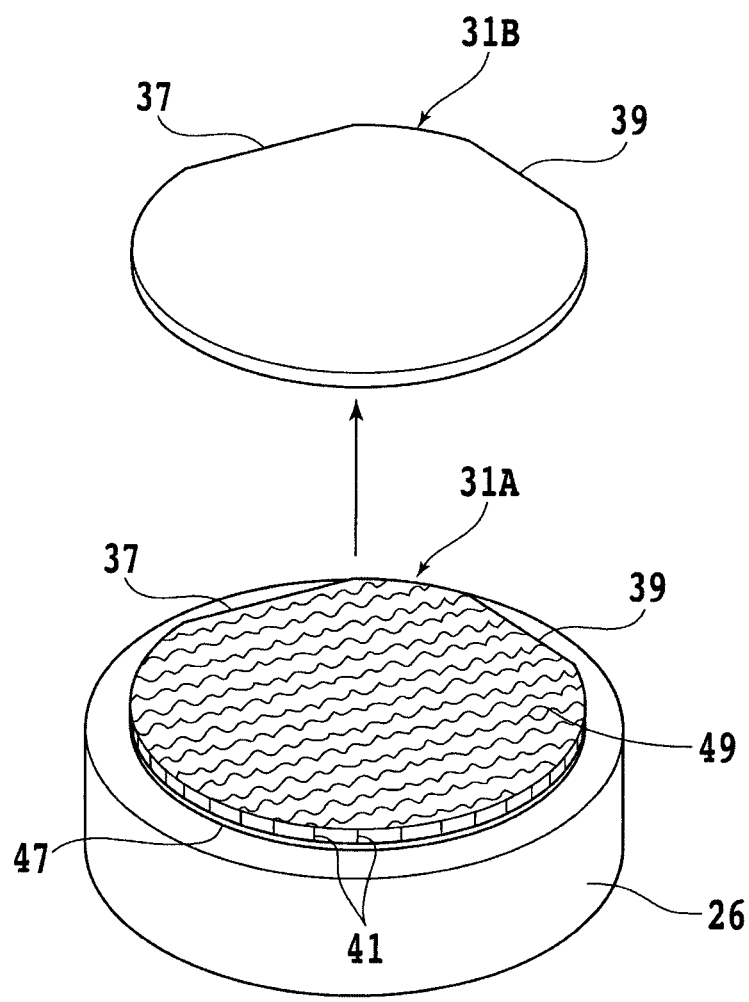
FIG. 14 is a perspective view showing a condition where the SiC wafer has been separated into first and second wafers by performing the wafer separating step.

As shown in FIG. 14, the wafer 31A held on the chuck table 26 has a separation surface 49 as the back side. The separation surface 49 is a slightly rough surface where the modified layers 43 and the cracks 45 are partially left. That is, microscopic asperities are formed on the separation surface 49. Accordingly, it is preferable to perform a grinding step of grinding the separation surface 49 as the back side of the wafer 31A to thereby flatten the separation surface 49.

Figure 15:
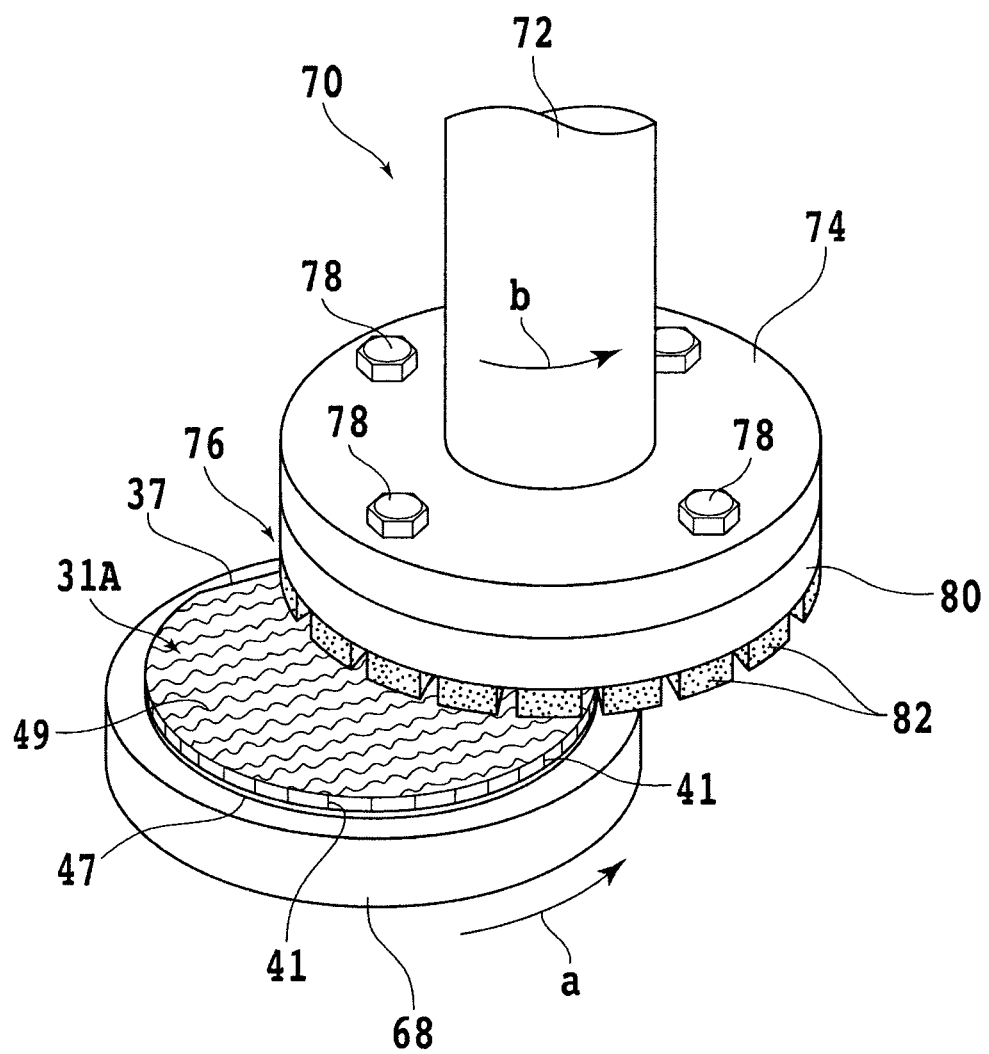
FIG. 15 is a perspective view showing a grinding step of grinding the back side of the first wafer to thereby flatten the back side thereof.

In performing this grinding step, the wafer 31A is held under suction through the protective tape 47 on a chuck table 68 included in a grinding apparatus (not shown) in the condition where the separation surface 49 is exposed upward as shown in FIG. 15. In FIG. 15, reference numeral 70 denotes a grinding unit included in the grinding apparatus. The grinding unit 70 includes a spindle 72 adapted to be rotationally driven by a motor (not shown), a wheel mount 74 fixed to the lower end of the spindle 72, and a grinding wheel 76 detachably mounted to the lower surface of the wheel mount 74 by a plurality of screws 78. The grinding wheel 76 is composed of an annular wheel base 80 and a plurality of abrasive members 82 fixed to the lower surface of the wheel base 80 so as to be arranged along the outer circumference thereof.

Figure 16:
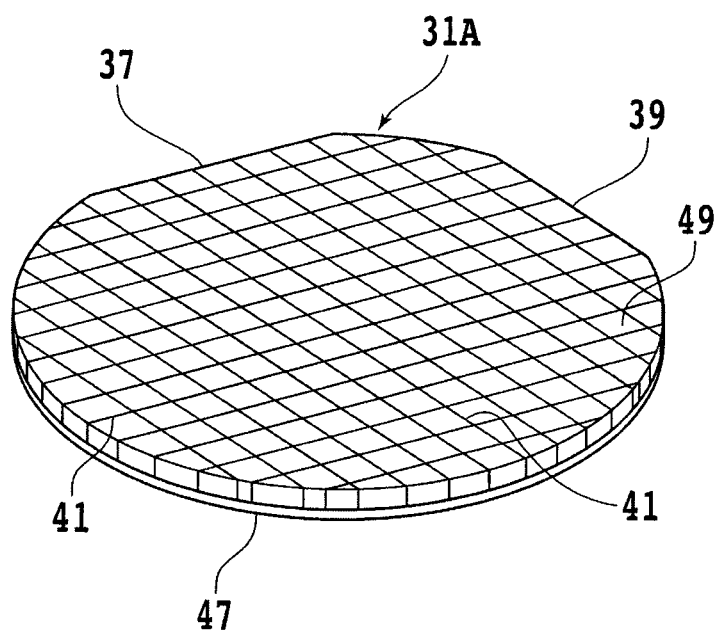
FIG. 16 is a perspective view of the first wafer flattened by the grinding step as viewed from the back side of the first wafer, wherein the first wafer has been divided into individual device chips at the division start point.

In the grinding step, the chuck table 68 is rotated at 300 rpm, for example, in the direction shown by an arrow a in FIG. 15. At the same time, the grinding wheel 76 is rotated at 6000 rpm, for example, in the direction shown by an arrow b in FIG. 15. Further, a grinding unit feeding mechanism (not shown) is driven to lower the grinding unit 70 until the abrasive members 82 of the grinding wheel 76 come into contact with the separation surface 49 of the wafer 31A held on the chuck table 68. Then, the grinding wheel 76 is fed downward by a predetermined amount at a predetermined feed speed (e.g., 0.1 μm/second), thereby grinding the separation surface 49 of the wafer 31A to flatten the separation surface 49. As a result, the modified layers 43 and the cracks 45 left on the separation surface 49 of the wafer 31A can be removed to obtain a flat surface as shown in FIG. 16. Further, the grooves 41 are exposed to the flat surface (back side) of the wafer 31A, thereby dividing the wafer 31A into individual device chips.

In the case of forming the modified layers as the division start point in the third preferred embodiment of the division start point forming step as described above, the modified layers are broken by a pressing force applied from the grinding wheel 76 to the wafer 31A, thereby dividing the wafer 31A into individual device chips. In the case of flattening the back side of the wafer 31A obtained by the wafer separating step mentioned above, it is only necessary to slightly grind the back side of the wafer 31A by an amount of approximately 1 μm to 5 μm, so that the wear amount of the abrasive members 82 can be suppressed to approximately 4 μm to 25 μm. Further, the wafer 31B separated from the wafer 31A in FIG. 14 can be reused as an SiC substrate, thereby achieving great economy.

As another preferred embodiment of the separation start point forming step, the separation start point composed of the modified layers 43 and the cracks 45 may be formed so as to be superimposed on the grooves 41. In this case, the wafer 31A held on the chuck table 26 can be divided into individual device chips by performing the wafer separating step shown in FIGS. 13A and 13B. Also in this case, the back side of the wafer 31A (each device chip) is preferably ground to remove the modified layers 43 and the cracks 45 left on the back side of the wafer 31A, thereby flattening the back side of the wafer 31A.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method for dividing a wafer into individual device chips, said wafer being formed from an SiC substrate having a first surface, a second surface opposite to said first surface, a c-axis extending from said first surface to said second surface, and a c-plane perpendicular to said c-axis, said wafer having a plurality of devices formed on said first surface of said SiC substrate so as to be separated by a plurality of crossing division lines, said wafer processing method comprising:

a division start point forming step of forming a division start point having a depth corresponding to the finished thickness of each device chip along each division line formed on said first surface;

a protective member providing step of providing a protective member on said first surface after performing said division start point forming step;

a separation start point forming step of setting the focal point of a laser beam having a transmission wavelength to said SiC substrate inside said SiC substrate at a predetermined depth from said second surface, which depth corresponds to a vertical position near said division start point, after performing said protective member providing step, and then applying said laser beam to said second surface as relatively moving said focal point and said SiC substrate to thereby form a modified layer parallel to said first surface and cracks extending from said modified layer along said c-plane, thus forming a separation start point; and a wafer separating step of applying an external force to said wafer after performing said separation start point forming step, thereby separating said wafer into a first wafer having said first surface of said SiC substrate and a second wafer having said second surface of said SiC substrate at said separation start point;

said separation start point forming step including a modified layer forming step of relatively moving the focal point of said laser beam in a first direction perpendicular to a second direction where said c-axis is inclined by an off angle with respect to a normal to said second surface and said off angle is formed between said second surface and said c-plane, thereby linearly forming said modified layer extending in said first direction, and an indexing step of relatively moving said focal point in said second direction to thereby index said focal point by a predetermined amount.

2. The wafer processing method according to claim 1, wherein said first wafer is divided into said individual device chips by separating said wafer into said first wafer and said second wafer in said wafer separating step.

3. The wafer processing method according to claim 2, further comprising a grinding step of grinding the back side of each device chip after performing said wafer separating step, thereby flattening the back side of each device chip.

4. The wafer processing method according to claim 1, further comprising a grinding step of grinding the back side of said first wafer after performing said wafer separating step, thereby flattening the back side of said first wafer and dividing said first wafer into said individual device chips.

* * * * *